(12) United States Patent
Huang et al.

(10) Patent No.: US 9,252,727 B2
(45) Date of Patent: Feb. 2, 2016

(54) PERIPHERAL APPARATUS

(71) Applicant: KYE SYSTEMS CORP., New Taipei (TW)

(72) Inventors: Jen-Fu Huang, New Taipei (TW); Chih-Chien Liao, New Taipei (TW); Nine-Ren Kang, Diamond Bar, CA (US)

(73) Assignee: KYE SYSTEMS CORP., New Taipei (TW)

( * ) Notice: Subject to any disclaimer, the term of this patent is extended or adjusted under 35 U.S.C. 154(b) by 378 days.

(21) Appl. No.: 13/765,739

(22) Filed: Feb. 13, 2013

(65) Prior Publication Data
US 2013/0208920 A1   Aug. 15, 2013

(30) Foreign Application Priority Data
Feb. 15, 2012   (TW) .............................. 101104961 A

(51) Int. Cl.
*H04R 25/00* (2006.01)
*H03G 1/00* (2006.01)
*H03G 3/30* (2006.01)
*H03F 3/21* (2006.01)

(52) U.S. Cl.
CPC .. *H03G 1/00* (2013.01); *H03F 3/21* (2013.01); *H03G 3/3005* (2013.01); *H03G 3/3026* (2013.01); *H04R 2420/05* (2013.01); *H04R 2420/09* (2013.01)

(58) Field of Classification Search
CPC ... H04R 5/04; H04R 2420/05; H04R 2420/09
See application file for complete search history.

(56) References Cited

U.S. PATENT DOCUMENTS

2008/0008337 A1*  1/2008  Liu ................................ 381/120
2011/0239009 A1*  9/2011  Noda ............................ 713/300

* cited by examiner

*Primary Examiner* — Duc Nguyen
*Assistant Examiner* — Kile Blair
(74) *Attorney, Agent, or Firm* — Bacon & Thomas, PLLC

(57) ABSTRACT

A peripheral apparatus, for connecting to a first or a second transmission port of an electronic device, includes a signal transmission interface, a triggering unit, an amplifying unit and an adjusting unit. The signal transmission interface, coupled to the first or the second transmission port, includes a first and a second group of pins. The triggering unit is coupled to the signal transmission interface. When the signal transmission interface is coupled to the first or the second transmission port, the triggering unit outputs a first or a second voltage level signal, respectively. The amplifying unit is coupled to the signal transmission interface and a functional unit. The adjusting unit, coupled to the signal transmission interface, the triggering unit, the amplifying unit and the functional unit, changes an output power transmitted from the amplifying unit to the functional unit according to the first or the second voltage level signal.

9 Claims, 4 Drawing Sheets

PERIPHERAL APPARATUS

CROSS-REFERENCE TO RELATED APPLICATIONS

This non-provisional application claims priority under 35 U.S.C. §119(a) on Patent application ser. No(s). 101104961 filed in Taiwan, R.O.C. on Feb. 15, 2012, the entire contents of which are hereby incorporated by reference.

TECHNICAL FIELD

The disclosure relates to a peripheral apparatus, and in particularly to a peripheral apparatus for determining types of power supply or power distribution.

BACKGROUND

A universal serial bus interface (USB) which is applicable for an electronic device (such as, computer) is connected to a signal transmission interface of a peripheral apparatus (such as, flash disk, keyboard, mouse, speaker and so on) so as to provide convenient and rapid connection ways. With advances in technology, larger transmitting bandwidth of the USB has been developed. The largest bandwidth of standard USB 1.1 is 12 megabits per second (Mbps), and that of USB 2.0 is 480 Mbps. Currently, the largest bandwidth of USB 3.0 is increased from 480 Mbps to 5 gigabits per second (Gbps).

The advances in USB also improve power supply for the peripheral apparatus. Take USB 2.0 for example, USB 2.0 not only transmit data in both directions but also supply power with 5 volts and 500 milliamperes. Moreover, applying USB 3.0, information transmitting rate may be up to 5 Gbps and power is supplied with 5 volts and 900 milliamperes. When a speaker having a USB 3.0 interface is directly connected to a USB 3.0 transmission port of a computer, the output power of the speaker is increased and the sound effect (namely, quality) is also improved.

The development of USB is to provide better effects (namely quality), but actual requirement also needs to be considered. Updating of USB version needs to provide backward compatibility (compatible with former version of USB). However, for most users, when the USB version is improved, most users may not clearly distinguish the transmission port of the computer or the transmission port of the peripheral apparatus. For example, the version of the transmission port of the computer is USB 2.0 and the transmission port of the speaker is USB 3.0. Because the USB 3.0 version allows backward compatibility, the USB 3.0 interface transmission port of the speaker may be inserted into the USB 2.0 interface transmission port of the computer. However, electrical circuits in the speaker are designed to match with USB 3.0 circuits with larger current inputting, such that current provided by USB 2.0 interface transmission port of the computer may not match with the USB 3.0 electrical circuits in the speaker.

It can be known from a relation of power (P), current (I) and voltage (V): P=IV, The optimized output power of the USB 3.0 speaker is 4 watts, when the USB 3.0 interface transmission port is inserted into the computer, the speaker may receive 4.5 Watts of input power (5 volts times 0.9 amperes), the optimized effect is achieved. When the USB 2.0 interface transmission port is inserted, the speaker may only receive 2.5 watts of input power (5 volts times 0.5 amperes). Therefore, voice cracks may occur and the volume of the sound generated by the speaker may be suddenly increased and decreased.

SUMMARY

An embodiment of the disclosure provides a peripheral apparatus, for connecting to a first transmission port or a second transmission port of an electronic device. The peripheral apparatus comprises a signal transmission interface, a triggering unit, an amplifying unit and an adjusting unit. The signal transmission interface comprises a first group of pins and a second group of pins. The signal transmission interface is coupled to and corresponds to the first transmission port or the second transmission port. The triggering unit is coupled to the signal transmission interface. When the signal transmission interface is coupled to the first transmission port, the triggering unit outputs a first voltage level signal. When the signal transmission interface is coupled to the second transmission port, the triggering unit outputs a second voltage level signal. The amplifying unit is coupled to the signal transmission interface and at least one functional unit. The adjusting unit is coupled to the signal transmission interface, the triggering unit, the amplifying unit and the at least one functional unit. The adjusting unit changes an output power transmitted from the amplifying unit to the at least one functional unit according to the first voltage level signal or the second voltage level signal generated by the triggering unit.

Another embodiment provides a peripheral apparatus for connecting a first transmission port or a second transmission port of an electronic device. The peripheral apparatus comprises a signal transmission interface, a triggering unit, an amplifying processing unit. The signal transmission interface comprises a first group of pins and a second group of pins. The signal transmission interface is coupled to and corresponds to the first transmission port or the second transmission port. The triggering unit is coupled to the signal transmission interface. When the signal transmission interface is coupled to the first transmission port, the triggering unit outputs a first voltage level signal. When the signal transmission interface is coupled to the second transmission port, the triggering unit outputs a second voltage level signal. The amplifying processing unit is coupled to the signal transmission interface, the triggering unit and at least one functional unit. The amplifying processing unit changes an output power transmitted to the at least one functional unit according to the first voltage level signal or the second voltage level signal generated by the triggering unit.

BRIEF DESCRIPTION OF THE DRAWINGS

The disclosure will become more fully understood from the detailed description given herein below for illustration only, thus does not limit the disclosure, wherein.

DETAILED DESCRIPTION

Figure 1:
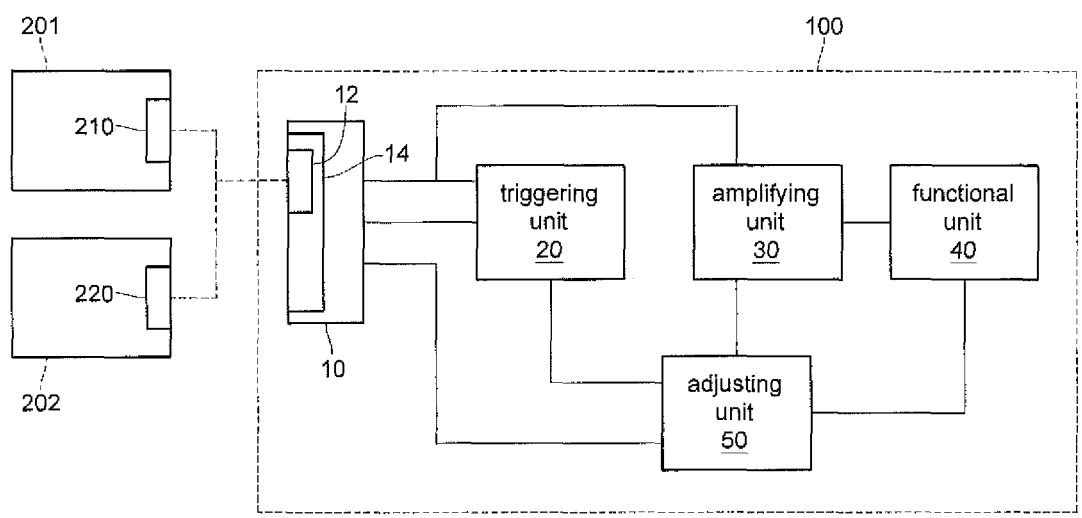
FIG. 1 is a block diagram of a peripheral apparatus and two electronic devices according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A peripheral apparatus provided in this disclosure is used for connecting to an electronic device to provide a plurality of functional modes. The electronic device is a computer (a desktop computer, a laptop computer or a tablet computer), a multi-media player or a USB power adapter having a USB 2.0 interface transmission port or a USB 3.0 transmission port, but not limited to the disclosure. The peripheral apparatus is a speaker, a fan or a lighting device, but not limited to the disclosure. In the following embodiments, a speaker is connected to a computer for exemplary. Furthermore, the electronic device also includes a transmission port, and the peripheral apparatus includes a signal transmission interface. The transmission standards adopted by the transmission port and the signal transmission interface may be a USB transmission interface, or an Institute of Electrical and Electronics Engineers (IEEE) transmission interface. In the following embodiments, the USB is used for exemplary.

The USB has a plurality of standard versions, such as, USB1.0, USB 1.1, USB 2.0 and USB 3.0. The peripheral apparatus according to the following embodiments of the disclosure, the USB 3.0 is defined as present version, and the USB 2.0 is defined as former version, but not limited to the disclosure. In some other embodiments of the disclosure, the present version and the former version is a comparative relationship between them. For example, the present version is the USB 2.0, and both of the USB 1.0 and the USB 1.1 are considered as former versions.

Please refer to FIG. 1, which is a block diagram of a peripheral apparatus and two electronic devices according to a first embodiment of the disclosure. A peripheral apparatus 100 is used for connecting to a first transmission port 210 of an electronic device 201 or a second transmission port 220 of an electronic device 202. The peripheral apparatus 100 comprises a signal transmission interface 10, a triggering unit 20, an amplifying unit 30, at least one functional unit 40 and an adjusting unit 50. The signal transmission interface 10 comprises a first group of pins 12 and a second group of pins 14. The signal transmission interface 10 may be coupled to and correspond to the first transmission port 210 or the second transmission port 220. The triggering unit 20 is coupled to the signal transmission interface 10. The amplifying unit 30 is coupled to the signal transmission interface 10, and the amplifying unit 30 is coupled to the at least one functional unit 40. The adjusting unit 50 is coupled to the signal transmission interface 10, the triggering unit 20, the amplifying unit 30 and the functional unit 40.

Please continuously refer to FIG. 1. When the signal transmission interface 10 is coupled to the first transmission port 210, the triggering unit 20 outputs a first voltage level signal. When the signal transmission interface 10 is coupled to the second transmission port 220, the triggering unit outputs a second voltage level signal. The adjusting unit 50 adjusts and changes an output power transmitted from the amplifying unit 30 to the functional unit 40 according to the first voltage level signal or the second voltage level signal generated by the triggering unit 20.

Figure 2:
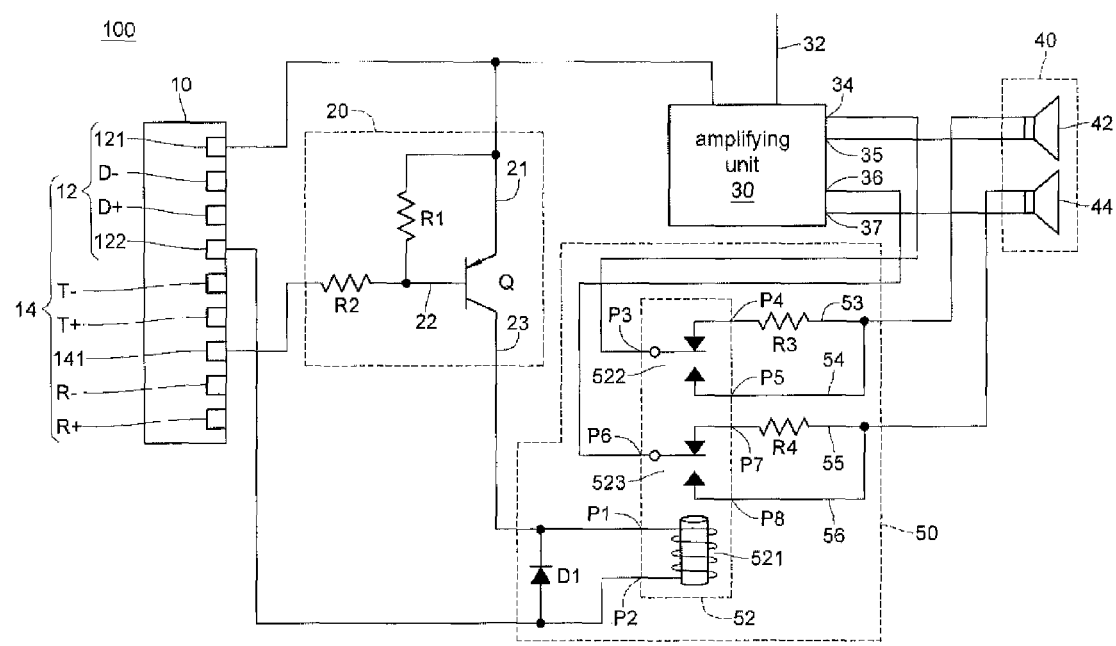
FIG. 2 is a circuit diagram of a peripheral apparatus according to a first embodiment of the disclosure.

Please refer to FIG. 2, which is a circuit diagram of a peripheral apparatus according to a first embodiment of the disclosure. In this embodiment, the functional unit 40 which is shown in the circuit diagram of the peripheral apparatus 100 is a dual-channel speaker, and the amplifying unit 30 matches with the power and current standards (i.e., specification) of the speaker with dual channel. The first group of pins 12 of the signal transmission interface 10 comprises a power pin 121, a first information transmitting pin D−, a second information transmitting pin D+ and a first ground pin 122. The second group of pins 14 comprises the power pin 121, the first information transmitting pin D−, the second information transmitting pin D+, a third information transmitting pin T−, a fourth information transmitting pin T+, a fifth information transmitting pin R−, a sixth information transmitting pin R+, the first ground pin 122 and a second ground pin 141.

In this embodiment, the signal transmission interface 10 is compliant with USB 3.0 type-A transmission (connector) standard, but not limited to disclosure. In other embodiment, the signal transmission interface 10 is also compliant with the connector interface standard of USB 3.0 type-B, USB 3.0 type Mini-A or the USB 3.0 type Mini-B. The first group of pins 12 is group pins compliant with the transmission standard of the USB 2.0, the second group of pins 14 is compliant with the transmission standard of the USB 3.0, and therefore the signal transmission interface 10 is adapted for being connected to any two interfaces with different transmission standards.

In this embodiment, the first transmission port 210 of the electronic device 201 which is connected to the signal transmission interface 10 of the peripheral apparatus 100 is the former version of the transmission port (USB 2.0) of the signal transmission interface 10. The second transmission port 220 of the electronic device 202 is the present version of the transmission port (USB 3.0) of the signal transmission interface 10. For USB interface transmission ports, both of the power pin 121 of the former-version transmission ports and the present-version of transmission ports are adapted for receiving positive voltage power supply.

Please continuously refer to FIG. 2, in this embodiment, for example, the triggering unit 20 comprises a transistor Q, a first resistor R1 and a second resistor R2. The transistor Q comprises a first terminal 21, a second terminal 22 and a third terminal 23. The first terminal 21 is coupled to the power pin 121. The second terminal 22 is coupled to the second ground pin 141. The third terminal 23 is coupled to the adjusting unit 50. The transistor Q is a PNP transistor, the first terminal 21 is emitter, the second terminal 22 is base, the third terminal 23 is collector. The first resistor R1 is coupled between the first terminal 21 and the second terminal 22. The second resistor R2 is coupled between the second ground pin 141 and a node which is between the second terminal 22 and the first resistor R1.

When the signal transmission interface 10 is coupled to the former-version (USB 2.0) transmission port, the second ground pin 141 of the second group of pins 14 of the signal transmission interface 10 is in a floating state. Therefore, the transistor Q is not conducted, and the third terminal 23 may not output any current or voltage signal such that the third terminal 23 is in a low voltage level. The low voltage level is the first voltage level signal outputted by the triggering unit 20.

When the signal transmission interface 10 is coupled to the present-version (USB 3.0) transmission port, the second ground pin 141 of the second group of pins 14 is in a ground state. Moreover, because the first terminal 21 receives a positive power from the power pin 121, the transistor Q is in a forward active region. The variation in current for the third terminal 23 is in proportion to the value of the current inputting of the second terminal 22. Therefore, compared to the floating state of the second terminal, the voltage level of the current outputting of the third terminal 23 is in a high voltage level outputting. The high voltage level is the second voltage level signal outputted by the triggering unit 20.

The above description of the FIG. 2 disclose how the triggering unit 20 outputs a first voltage level signal and a second voltage level signal according to one of the embodiments, but the electronic elements of the triggering unit 20 are not limited to the disclosure. In other embodiments, for example, the transistor Q is an NPN transistor, and the connection relationships of the first resistor R1, the second resistor R2 and the transistor Q are adjusted according to the type of the transistor Q such that the triggering unit 20 may output a level signal with high voltage level when the signal transmission interface 10 is coupled to the present-version transmission port as well as outputting a level signal with low voltage level when the signal transmission interface 10 is coupled to the former-version transmission port.

Please continuously refer to FIG. 2. The dual-channel speaker of the embodiment comprises a first speaker 42 and a second speaker 44. The amplifying unit 30 further comprises an alternate current (AC) signal inputting terminal 32, a first amplifying signal outputting terminal 34, a second amplifying signal outputting terminal 36, a first ground signal terminal 35 and a second ground signal terminal 37.

The AC signal inputting terminal 32 is adapted for receiving an audio source signal, and the amplifying unit 30 outputs this audio source signal (i.e., alternate current signal) to the first speaker 42 and the second speaker 44 after the audio source signal is amplified by the adjusting unit 50. Both the first amplifying signal outputting terminal 34 and the second amplifying signal outputting terminal 36 are coupled to the adjusting unit 50. The first ground signal terminal 35 is coupled to the first speaker 42. The second ground signal terminal 37 is coupled to the second speaker 44. The adjusting unit 50 is adapted for adjusting the output powers of the first amplifying signal outputting terminal 34 and the second amplifying signal outputting terminal 36 of the amplifying unit 30 according to the first voltage level signal and the second voltage level signal generated by the triggering unit 20.

Please continuously refer to FIG. 2. The adjusting unit 50 further comprises a relay 52, a first loading wire 53, a first short circuit wire 54, a second loading wire 55 and a second short circuit wire 56. The first loading wire 53 has a third resistor R3. The second loading wire 55 has a fourth resistor R4. In this embodiment, the relay 52 is a Double-Pole Double-Throw (DPDT) relay and includes eight contacts, a control coil 521, a first switch 522 and a second switch 523. The eight contacts are a first contact P1, a second contact P2, a third contact P3, a fourth contact P4, a fifth contact P5, a sixth contact P6, a seventh contact P7 and an eighth contact P8. In this embodiment, the first contact P1 and the second contact P2 are contacts of the control coil 521. The third contact P3, the fourth contact P4 and the fifth contact P5 are contacts of the first switch 522. The sixth contact P6, the seventh contact P7 and the eighth contact P8 are contacts of the second switch 523.

Please continuously refer to FIG. 2. The first contact P1 is coupled to the third terminal 23 of the transistor Q. The second contact P2 is coupled to the first ground pin 122 of the signal transmission interface 10. The third contact P3 is coupled to the first amplifying signal outputting terminal 34 of the amplifying unit 30. The fourth contact P4 is coupled to the first loading wire 53. The fifth contact P5 is coupled to first short circuit wire 54. The sixth contact P6 is coupled to the second amplifying signal outputting terminal 36 of the amplifying unit 30. The seventh contact P7 is coupled to the second loading wire 55. The eighth contact P8 is coupled to the second short circuit wire 56.

By the connections of the eighth contacts P1 to P8 of the relay 52, When the triggering unit 20 outputs the first voltage level signal (low voltage level), there is no current passing through the first contact P1 and the second contact P2 of the control coils 521, and therefore the connections states of the first switch 522 and the second switch 523 are that the third contact P3 and the fourth contact P4 are connected to each other as well as the sixth contact P6 and the seventh contact P7 are connected to each other. At this time, the audio signal, outputted from the first amplifying signal outputting terminal 34 of the amplifying unit 30, passes through the first loading wire 53. The audio signal, outputted from the second amplifying signal outputting terminal 36, passes through the second loading wire 55. Therefore, the power outputted by the amplifying unit 30 is partially consumed such that both the first speaker 42 and the second speaker 44 receive lower power but output the audio signals with more stable power.

When the triggering unit 20 outputs a second voltage level signal (high voltage level), the current passes through the first contact P1 and the second contact P2 of the control coil 521, such that the connection relationships of the first switch 522 and the second switch 523 are that the third contact P3 and the fifth contact P5 are connected to each other as well as the sixth contact P6 and the eighth contact P8 are connected to each other. Therefore, both the first speaker 42 and the second speaker 44 receive larger outputted power. Also, outputting the second voltage level signal by the triggering unit 20 indicates that the signal transmission interface 10 is coupled to the USB 3.0 interface transmission port, and therefore the speaker may still receive stable audio signal without the audio signal to be consumed passing through the loading wire. Moreover, in this embodiment, a diode Dl, coupled between the first contact P1 and the second contact P2, is adapted for preventing form counter-electromotive force.

Please continuously refer to FIG. 2. In this embodiment, the signal source of the AC signal inputting terminal 32 of the amplifying unit 30 is obtained that an electronic device (such as a computer, a portable media player or a music storage device) is additionally inserted into the AC signal inputting terminal, but not limited to the disclosure. In other embodiments, the signal source of the AC signal inputting terminal is obtained from the first information transmitting pin D+ and the second information transmitting pin D− of the signal transmission interface 10. Moreover, the signal source may be obtained by some other pins of the signal transmission interface 10 which are adapted for information transmitting.

Please continuously refer to FIG. 2. In this embodiment, the functional unit 40 is the dual-channel speaker, but not limited to the disclosure. In some other embodiments, the functional unit is an AC driving circuit, and this AC driving circuit needs an amplifying power outputted stably to be applicable for the functional unit 40. Similarly, the relay 52 of the adjusting unit 50 is not limited to the DPDT relay. In other embodiments, when the functional unit 40 is a single-channel speaker, the relay 52 is a Single-Pole Single-Throw (SPST) relay.

Please continuously refer to FIG. 2, in order to clearly describe the process for adjusting power outputting, the following describes the calculation of variation in output power. In this embodiment, the amplifying unit 30 matching with the USB 3.0 interface transmission port and the functional unit 40 matching with the power and current standard (specification) of the dual-channel speaker having the USB 3.0 interface transmission port are for exemplary. Moreover, each of the first speaker 42 and the second speaker 44 having 4 ohms of loading and matching with 2 watts of output power is assumed. When the signal transmission interface 10 is coupled to the present-version (USB 3.0) transmission port, the second ground pin 141 is grounded, and the power pin 121 inputs power with 5 volts and 900 milliamperes. According to the relation of current (I), voltage (V) and power (P):

$$P=IV$$

The signal transmission interface 10 may receive power with 4.5 watts, and the triggering unit 20 generates a second voltage level signal (high voltage level) such that an output signal in the adjusting unit 50 passes through the a short circuit wire set, that is, the first short circuit wire 54 and the second short circuit wire 56. After being consumed by some inner circuit of the amplifying unit 30, the power with 2 watts are outputted by the first amplifying signal outputting terminal 34 and the second amplifying signal outputting terminal 36. Then, each of the first speaker 42 and the second speaker 44 receives the power with 2 watts, respectively.

When the signal transmission interface 10 is coupled to the former-version (USB 2.0) transmission port, the second ground pin 141 is in a floating state, and the power pin 121 inputs power with 5 volts and 500 milliamperes. At this time, the signal transmission interface 10 may receive power with 2.5 watts of. The triggering unit 20 generates the first voltage level signal (low voltage level) such that the output signal in the adjusting unit 50 may pass through the loading wire set, that is, the first loading wire 53 and the second loading wire 55. In this embodiment, each of the first loading wire 53 and the second loading wire 55 has a resistor with four ohms of resistance. Therefore, after being stably consumed by the loading wire set, the output powers of the amplifying unit 30 which outputs to the first speaker 42 and the second speaker 44 are 1 watt, respectively.

Figure 3:
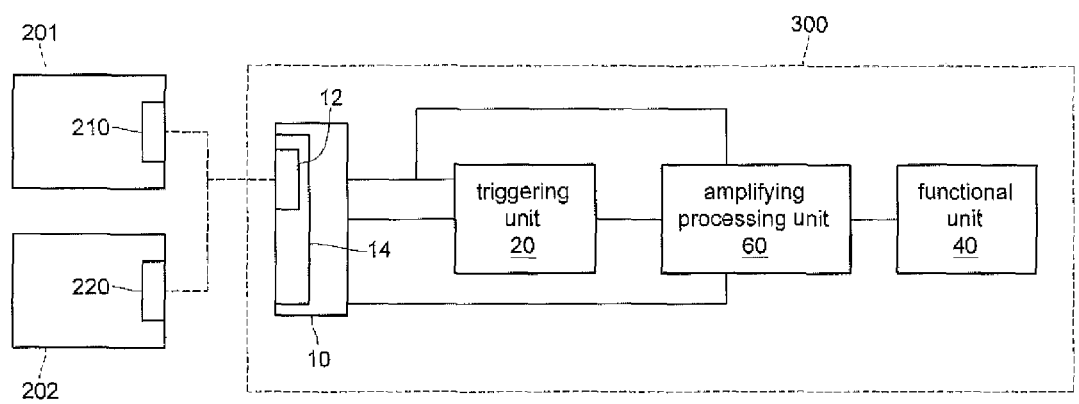
FIG. 3 is a block diagram of a peripheral apparatus and two electronic devices according to a second embodiment of the disclosure.

Please refer to FIG. 3, which is a block diagram of a peripheral apparatus and two electronic devices according to a second embodiment of the disclosure. The same numerals in the second embodiment and the first embodiment represent the same elements and the same coupling relationships, and therefore the repeated is not described herein. A peripheral apparatus 300 in the second embodiment is adapted for connecting to a first transmission port 210 of an electronic device 201 or a second transmission port 220 of the electronic device 202. The peripheral apparatus 300 comprises a signal transmission interface 10, a triggering unit 20, an amplifying processing unit 60 and at least one functional unit 40.

The signal transmission interface 10 comprises a first group of pins 12 and a second group of pins 14. The signal transmission interface 10 corresponds to and is coupled to the first transmission port 210 or the second transmission port 220. The triggering unit 20 is coupled to the signal transmission interface 10. The amplifying processing unit 60 is coupled to the signal transmission interface 10 and the triggering unit 20. The amplifying processing unit 30 is coupled to the at least one functional unit 40. The amplifying processing unit 60 is adapted for adjusting and changing the output power of the functional unit 40 according to a first voltage level signal or a second voltage level signal generated by the triggering unit 20.

Figure 4:
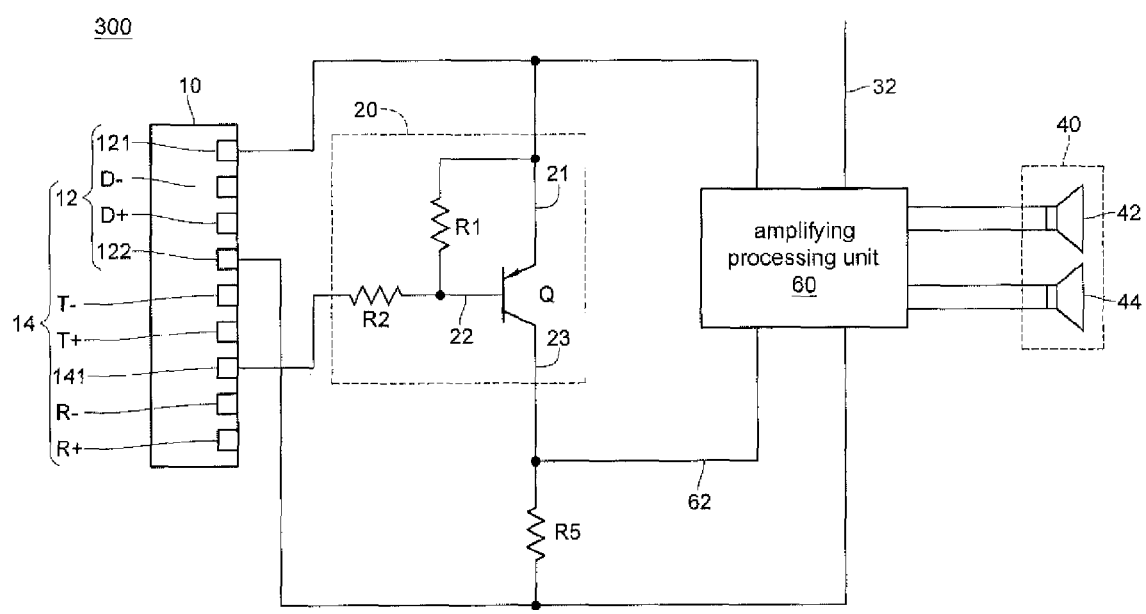
FIG. 4 is a circuit diagram of a peripheral apparatus according to a third embodiment of the disclosure.

Please refer to FIG. 4, which is a circuit diagram of a peripheral apparatus according to a third embodiment of the disclosure. An amplifying processing unit 60 comprises a gain control terminal 62 coupled to a third terminal 23 of a transistor Q. The amplifying processing unit 60 is adapted for adjusting output power according to a first voltage level signal or a second voltage level signal from a third terminal 23 received by the gain control terminal 62. In this embodiment, the peripheral apparatus 300 further comprises a fifth resistor R5 coupled between a first ground pin 122 and a node between the gain control terminal 62 and the third terminal 23. The fifth resistor R5 provides a divided voltage at the node between the third terminal 23 and the gain control terminal 62 when a triggering unit 20 outputs a second voltage level signal (high voltage level).

To sum up, the disclosure provides a peripheral apparatus. The peripheral apparatus has a signal transmission interface which may be connected to a present-version transmission port or a former-version transmission port. The present version means the same version with that of the signal transmission interface. When being connected to the former-version transmission port, the peripheral apparatus adjusts the output power so as to maintain stable power outputting. Therefore, no matter the signal transmission interface of the peripheral apparatus is coupled to the present-version transmission port or the former-version transmission port, all functions of the peripheral apparatus are operated normally.

What is claimed is:

1. A peripheral apparatus for connecting to a first transmission port or a second transmission port of an electronic device, the peripheral apparatus comprising:
   a signal transmission interface comprising a first group of pins and a second group of pins, and the signal transmission interface coupled to and being corresponding to the first transmission port or the second transmission port, wherein the first transmission port is a transmission port in a former version, the second transmission port is a transmission port in a present version, the first group of pins is compliant with the transmission port in the former version, the second group of pins is compliant with the transmission port in the present version;
   a triggering unit coupled to the signal transmission interface, when the signal transmission interface is coupled to the first transmission port, the triggering unit outputs a first voltage level signal, when the signal transmission interface is coupled to the second transmission port, the triggering unit outputs a second voltage level signal;
   an amplifying unit coupled to the signal transmission interface and at least one functional unit; and
   an adjusting unit coupled to the signal transmission interface, the triggering unit, the amplifying unit and the at least one functional unit;
   wherein the adjusting unit changes an output power transmitted from the amplifying unit to the at least one functional unit according to the first voltage level signal or the second voltage level signal generated by the triggering unit.

2. The peripheral apparatus according to claim 1, wherein the first group of pins comprises a power pin, a first information transmitting pin, a second information transmitting pin and a first ground pin, and wherein the second group of pins comprises the power pin, the first information transmitting pin, the second information transmitting pin, a third information transmitting pin, a fourth information transmitting pin, a fifth information transmitting pin, a sixth information transmitting pin, the first ground pin and a second ground pin.

3. The peripheral apparatus according to claim 2, wherein the first transmission port which is coupled to the signal transmission interface is a universal serial bus (USB) 2.0 interface transmission port, and the second transmission port which is coupled to the signal transmission interface is a USB 3.0 interface transmission port.

4. The peripheral apparatus according to claim 1, wherein the triggering unit comprises:
   a transistor comprising a first terminal, a second terminal and a third terminal, wherein the first terminal is coupled to a power pin, the second terminal is coupled to a second ground pin, and the third terminal is coupled to the adjusting unit;

a first resistor coupled between the first terminal and the second terminal; and a second resistor coupled between the second ground pin and a node between the second terminal and the first resistor;

wherein when the signal transmission interface is coupled to the first transmission port, the third terminal outputs the first voltage level signal, and when the signal transmission interface is coupled to the second transmission port, the triggering unit outputs the second voltage level signal.

5. The peripheral apparatus according to claim 1, wherein the adjusting unit comprises:

a relay coupled to the triggering unit, a first ground pin, the amplifying unit and the at least one functional unit;

a short circuit wire set coupled between the relay and the at least one functional unit, the short circuit wire set comprising at least one short circuit wire; and a loading wire set coupled between the relay and the at least one functional unit, the loading wire set comprising at least one loading wire;

wherein the short circuit wire set or the loading wire set is selected to be conducted according to the first voltage level signal and the second voltage level signal of the triggering unit.

6. A peripheral apparatus for connecting a first transmission port or a second transmission port of an electronic device, the peripheral apparatus comprising:

a signal transmission interface comprising a first group of pins and a second group of pins, the signal transmission interface coupled to and being corresponding to the first transmission port or the second transmission port, wherein the first transmission port is a transmission port in a former version, the second transmission port is a transmission port in a present version, the first group of pins is compliant with the transmission port in the former version, the second group of pins is compliant with the transmission port in the present version;

a triggering unit coupled to the signal transmission interface, when the signal transmission interface is coupled to the first transmission port, the triggering unit outputs a first voltage level signal, and when the signal transmission interface is coupled to the second transmission port, the triggering unit outputs a second voltage level signal; and an amplifying processing unit coupled to the signal transmission interface, the triggering unit and at least one functional unit;

wherein the amplifying processing unit changes an output power transmitted to the at least one functional unit according to the first voltage level signal or the second voltage level signal generated by the triggering unit.

7. The peripheral apparatus according to claim 6, wherein the first group of pins comprises a power pin, a first information transmitting pin, a second information transmitting pin and a first ground pin, and wherein the second group of pins comprises the power pin, the first information transmitting pin, the second information transmitting pin, a third information transmitting pin, a fourth information transmitting pin, a fifth information transmitting pin, a sixth information transmitting pin, the first ground pin and a second ground pin.

8. The peripheral apparatus according to claim 7, wherein the first transmission port which is coupled to the signal transmission interface is a USB 2.0 interface transmission port, and the second transmission port which is coupled to the signal transmission interface is a USB 3.0 interface transmission port.

9. The peripheral apparatus according to claim 6, wherein the triggering unit comprises:

a transistor comprising a first terminal, a second terminal and a third terminal, wherein the first terminal is coupled to a power pin, the second terminal is coupled to a second ground pin, the third terminal is coupled to the amplifying processing unit, and wherein the amplifying processing unit further comprises an alternate circuit signal inputting terminal;

a first resistor coupled between the first terminal and the second terminal; and a second resistor coupled between the second ground pin and a node between the second terminal and the first resistor;

when the signal transmission interface is coupled to the first transmission port, the third terminal outputs the first voltage level signal, and when the signal transmission interface is coupled to the second transmission port, the triggering unit outputs the second voltage level signal.

* * * * *